(12) United States Patent
Jung et al.

(10) Patent No.: US 6,922,270 B2
(45) Date of Patent: Jul. 26, 2005

(54) MULTI-STEP LANDING MICRO-MIRROR, METHOD FOR MANUFACTURING THE SAME AND MULTI-STEP LANDING MICRO-MIRROR ARRAY

(75) Inventors: Moon Youn Jung, Daejon-Shi (KR); Chi Hoon Jun, Daejon-Shi (KR); Chang Auck Choi, Daejon-Shi (KR); Yun Tae Kim, Daejon-Shi (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 10/735,669

(22) Filed: Dec. 16, 2003

(65) Prior Publication Data

US 2004/0130767 A1 Jul. 8, 2004

(30) Foreign Application Priority Data

Dec. 18, 2002 (KR) .................................. 10-2002-0081472

(51) Int. Cl.$^7$ .............................................. G02B 26/08
(52) U.S. Cl. ...................... 359/224; 359/296; 359/872
(58) Field of Search ................................ 359/223–226, 359/296, 871, 872, 838, 839

(56) References Cited

U.S. PATENT DOCUMENTS 6,431,714 B1 * 8/2002 Sawada et al. ............. 359/224

* cited by examiner

Primary Examiner—Euncha P. Cherry
(74) Attorney, Agent, or Firm—Mayer, Brown, Rowe & Maw LLP

(57) ABSTRACT

A multi-step landing micro-mirror, a method for manufacturing the same, and a multi-step landing micro-mirror array are disclosed. The multi-step landing micro-mirror comprises a trench formed in a substrate and having N−1 steps in one side wall thereof; N plates rotated in or on the trench; and 2N springs for connecting the plates to each other; wherein the N plates are composed of an outermost first plate, a second plate connected with the first plate by the spring and located in the first plate, . . . , and a N-th plate connected with a (N−1)-th plate by the spring and located in the (N−1)-th plate, wherein when voltages are applied to the N plates and the trench, respectively, the first plate is subjected to a first landing with a predetermined rotation angle on a first step of the trench due to the constant voltage, the second plate is subjected to a second landing with the predetermined rotation angle on a second step of the trench, . . . , the N-th plate is subjected to a N-th landing with the predetermined rotation angle on the other side wall of the trench. Accordingly, the low voltage driving can be performed by performing the multi-step driving during the electrostatic force is applied, the elastic force of the spring for supporting the mirror can be enhanced, therefore the reliability of the optical switch can be improved.

9 Claims, 11 Drawing Sheets

C

MULTI-STEP LANDING MICRO-MIRROR, METHOD FOR MANUFACTURING THE SAME AND MULTI-STEP LANDING MICRO-MIRROR ARRAY

BACKGROUND OF THE INVENTION

1. Field of the Invention

The present invention relates to a two dimensional digital micro-mirror, more specifically, to a multi-step landing micro-mirror, a method for manufacturing the same, and a multi-step landing micro-mirror array.

2. Description of the Prior Art

In an optical switch using a micro-mirror, various forces such as an electrostatic force, an electromagnetic force, a thermal expansion force, and a self stress force of a material are applied depending on the driving methods. Among them, the driving method using the electrostatic force has convenience of the manufacturing process, a low power consumption, tolerance for an external noise, compared with a different kind of actuation method. As the micro-mirror using the electrostatic force, the mirror attached with a torsion beam by a spring is commonly used. This uses a principle that a displacement angle is variable in proportional to an applied voltage.

The conventional torsion mirror type actuation method using the electrostatic force can be divided into the next two application examples. First, the three dimension micro-mirror precisely implements the rotation angle obtained when the strength of the electrostatic force is equal to that of the restoring force of the spring. On the other hand, the two dimensional micro-mirror is a state of switching off when the rotation angle is 0 degree, and when the rotation angle is 90 degree, it arranges the digital mirrors in a m×m (m=1,2,3, . . . , m) matrix shape. The spring, mechanically supporting the digital mirror should be sufficiently weak in order to increase a switching speed. However, the spring is sufficiently strong in order to increase the speed for restoring the mirror to the original location thereof due to the restoring force. Accordingly, the spring must be designed to have the optimal state under this trade-off relationship. In addition, the mirror must be designed strongly not to generate a translation displacement. The translation displacement means that the central axis is changed in generating the displacement angle. The material and the dimension of the spring, and the voltage applied to the mirror must be determined to satisfy the trade-off requirement.

Hereinafter, the problems of the conventional digital mirror will be explained with reference to FIGS. 1A and 1B.

FIGS. 1A and 1B illustrate a conventional digital mirror, wherein FIG. 1A is a perspective view of the digital mirror and FIG. 1B is a cross sectional view of the digital mirror. Referring to FIGS. 1A and 1B, a digital mirror comprises a plate 10, a mirror 11, a torsion spring 12, and a trench 13. In the digital mirror, one torsion spring is attached to each of the both ends of the mirror, and the torsion spring is subjected to the torsion stress of 90 degree even at the state of switching-on. At this time, the displacement angle θ for driving of the mirror is determined in the point that the electrostatic force due to the voltage is equal to the restoring force of the spring. The spring must be designed such that the mirror is rotated by 90 degree by the electrostatic force at the switching-on state and the mirror has a sufficient restoring force and a fast switching speed in the switching-off state. The electrostatic force is determined by the distance between an electrode applied to a voltage and the mirror size, when the size of the micro-mirror is determined. In addition, the restoring force is determined by a spring constant such as the material, the width, the thickness, and the length of the spring and the shape of the spring.

The cases that the rotation angle for driving the conventional digital mirror is 90 degree and 30 degree will be explained in comparison to each other.

The electrical torque $T_{elec.}$ for generating the displacement of the mirror is express by the next equation 1.

$$T_{elec.} = (½)e_o W V^2 \int x/[(d/\sin\theta - x)\theta]^2 dx$$

Further, the mechanical torque $T_{mech.}$ of the spring is expressed by the next equation 2.

$$T_{mech.} = 2(Gwt^3(1-(192t/x^5 w)\tan h(\pi w/2t)))\theta$$

Accordingly, if the needed rotation angle is large, the electrical torque becomes also large, so that the applied voltage must be large. In addition, in order to decrease the applied voltage, among the dimensions of the spring, the width w of the spring must be decreased, the length (l) thereof must be increased, or the thickness (t) thereof must be decreased. In Particular, since the mechanical torque $T_{mech.}$ in the equation 2 is proportional to the third power ($t^3$) of the thickness of the spring, the needed force can be decreased to $1/\sqrt{27}$, by decreasing the thickness of the spring to ⅓. Therefore, the voltage can be decreased to $1/\sqrt{27}$. However, if the thickness of the spring is ⅓, there is a problem that the central axis of the mirror is moved because of weaken mechanical support. Also, there could be a problem that the speed of the switch-off due to the decrease of the restoring force at the switching-off state is decreased.

The torsion spring 12 must endure the torsion stress by 90 degree, and it is very difficult that the central axis of the mirror is intended not to move even at such stress state. In addition, the large voltage is needed in order to rotate the mirror by 90 degree, so that there are the difficulty of the driving and the possibility of the arc plasma between mirror and trench when mirror is on state. The fatigue phenomenon of the spring due to the torsion stress by 90 degree affects the reliability.

SUMMARY OF THE INVENTION

Thus, the object of the present invention is to provide a multi-step landing micro-mirror, a method for manufacturing the same, and a multi-step landing micro-mirror array capable of improving reliability of the switching by strengthening the spring of the micro-mirror and driving the low voltage.

In order to accomplish the above-mentioned object, the multi-step landing micro-mirror according to the present invention comprises a trench formed in a substrate and having N−1 steps in one side wall thereof; N plates rotated in or on the trench; and 2N springs for connecting the plates to each other; wherein the N plates are composed of an outermost first plate, a second plate connected with the first plate by the spring and located in the first plate, . . . , and a N-th plate connected with a (N−1)-th plate by the spring and located in the (N−1)-th plate, wherein when voltages are applied to the N plates and the trench, respectively, the first plate is subjected to a first landing with a predetermined rotation angle on a first step of the trench due to the applied voltage, the second plate is subjected to a second landing with the predetermined rotation angle on a second step of the trench, . . . , the N-th plate is subjected to a N-th landing with the predetermined rotation angle on the other side wall of the trench.

In order to accomplish the above-mentioned object, the method for manufacturing the multi-step landing micro-mirror according to the present invention comprises the steps of forming a trench having N−1 steps formed in one side wall thereof in a substrate; forming a first insulating film in and on the substrate; depositing and patterning a conductive film in and on the substrate to form an electrode layer in and around the trench; forming a second insulating film in and on the substrate; attaching a silicon layer on and around the trench; and etching the silicon layer to form N plates and 2N springs for actuation elements.

In order to accomplish the above-mentioned object, in the multi-step landing micro-mirror array according to the present invention, the multi-step landing micro-mirrors are arranged on a same plane in a m×m matrix shape to obtain a plurality of the reflective light beams with respect to an incident light

DESCRIPTION OF THE EMBODIMENTS

Hereinafter, the preferred embodiments of the present invention will be explained with reference to the accompanying drawings. However, the embodiment of the present invention can be changed into a various type, and it should be not understood that the scope of the present invention is limit to the following embodiments. The embodiments of the present invention are provided in order to explain the present invention to those skilled in the art.

Figure 2A:
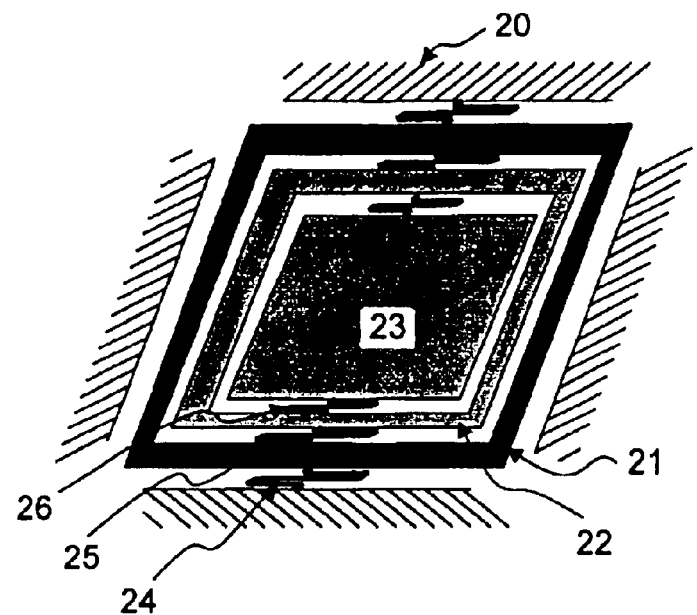
FIGS. 2A and 2B illustrate a micro-mirror having three plates and six springs according to a preferred embodiment of the present invention.
Figure 2B:
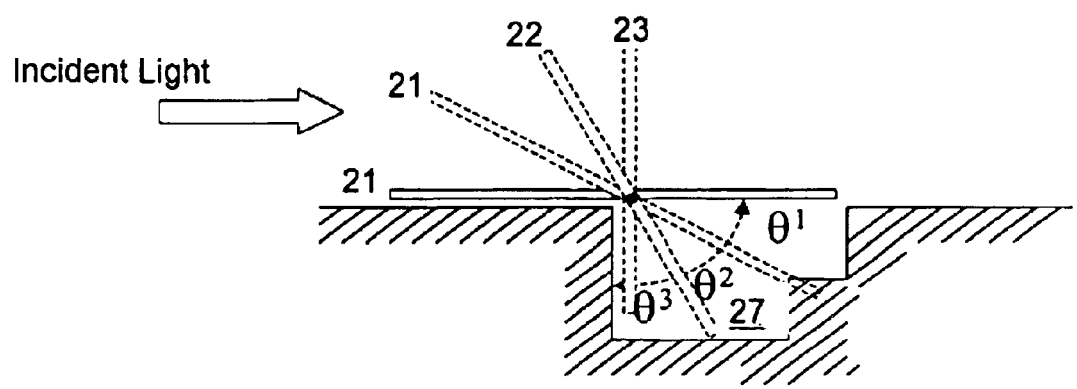

First, the structure of an actuator for a digital mirror according to the preferred embodiment of the present invention will be described. FIGS. 2A and 2B illustrate a digital micro-mirror of which three plates have two springs respectively, wherein FIG. 2A is the perspective view thereof and FIG. 2B is the cross sectional view thereof. The components of the actuator for driving the mirror can be roughly divided into two portions: a trench portion as a space region where each plate moves and a moving portion as a main body which is rotating under the electrostatic force and the restoring force.

First, the moving portion can be divided into the plates and the springs connected to the both sides of each plate. The plates comprise a first plate 20, a second plate 21, a third plate 22, and a fourth plate 23, and the springs comprise first springs 24, second springs 25, and third springs 26. The first plate 20 is the layer for supporting the actuator and has no movement, and the first springs 24 are attached to the both sides of the first plate 20 and connect the first plate 20 with the second plate 21 to mechanically and electrically, and is subjected to the torsion stress of 30 degree. The second plates 21 is located in the first plate 20 and rotated by 30 degree ($\theta_1$) with respect to the first plate 20 due to the electrostatic force, and the second springs 25 are attached to the both sides of the second plate 21 and connect the second plate 21 with the third plate 22 mechanically and electrically and is subjected to the torsion stress of 30 degree. The third plate 22 is located in the second plate 21 and rotated by 30 degree ($\theta_2$) with respect to the second plate 21 by the electrostatic force, and the third springs 26 are attached to the both sides of the third plate 22 and connect the third plate 22 with the fourth plate 23 mechanically and electrically and is subjected to the torsion stress of 30 degree. The fourth plate 23 rotates by 30 degree ($\theta_3$) with respect to the third plate 22 as the mirror plate. Among the above-mentioned components, the plates and the springs except for the first plate 20 are moved on or in the trench 27.

Second, the trench 27 is composed of two steps having the different depth each other. In the trench 27, a metal electrode for generating the electrostatic force is formed by applying the voltage.

Hereinafter, two-step trench will be explained in detail with reference to FIGS. 3 and 4.

Figure 3:
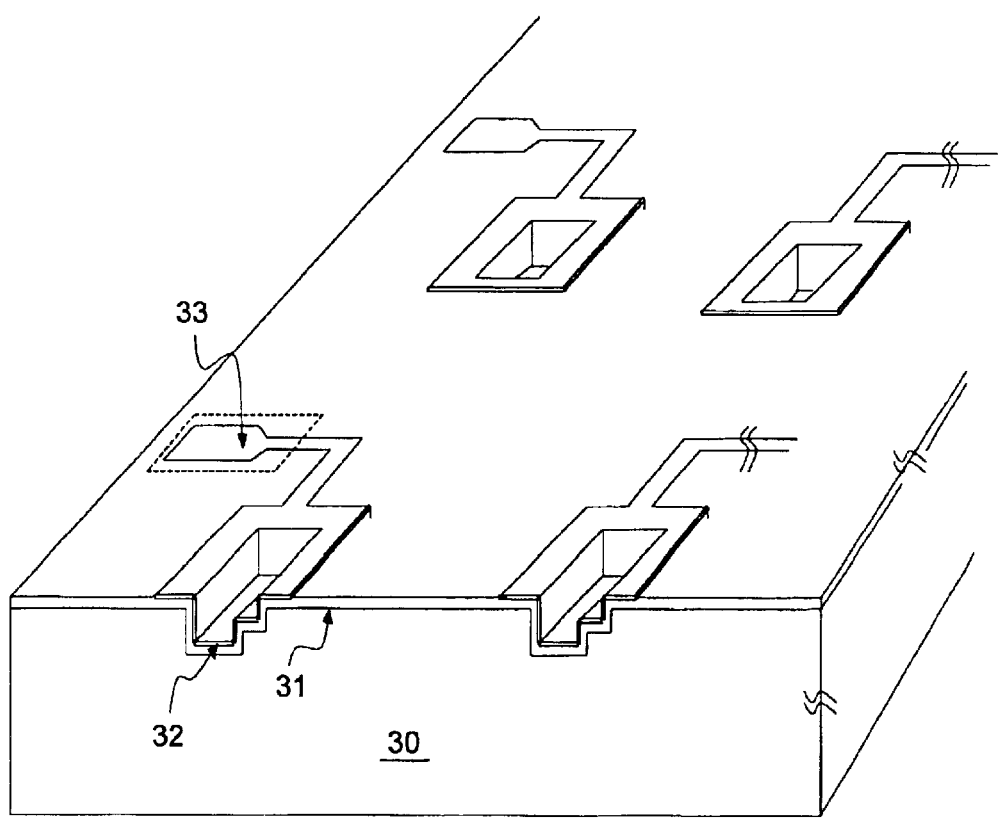
FIG. 3 is a perspective view illustrating a shape that 2-step trench formed in a substrate is arranged in a m×m matrix shape.

FIG. 3 is a perspective view illustrating a shape that two-step trench formed in a substrate are arranged in an m×m matrix shape (m is natural number). The substrate 30 may be a silicon substrate or a glass substrate, and FIG. 3 shows a shape that two-step trench formed on the substrate is arranged in only the 2×2 array shape.

Referring to FIG. 3, a first insulating film 31 is formed in the two-step trench and on the overall upper surface of the substrate, and a first electrode layer 32 is formed in and around each two-step trench. And, the first electrode layer 32 is connected with a pad electrode 33 to apply voltage. The method for forming the two-step trench shown in FIG. 3 will be explained. The two-step trench can be formed on the substrate by a delay-masking process ("delay-masking process for Silicon Three-Dimension Bulk Structures" Trans. IEE J(section), 1999). After the two-step trench is formed, the first insulating film 31 is formed on the overall upper surface of the substrate inside and outside the trench 31. And, the metal thin film is deposited on the overall substrate and then is patterned to form the first electrode layer 32. The first electrode layer 32 is formed such that there is no electrical cutting in a shallow trench, a deep trench, and the overall side wall inside the trench among the two-step trench. The first insulating film 31 prevents the voltage applied to the first electrode 33 from being applied to an adjacent trench element and the substrate.

Figure 4:
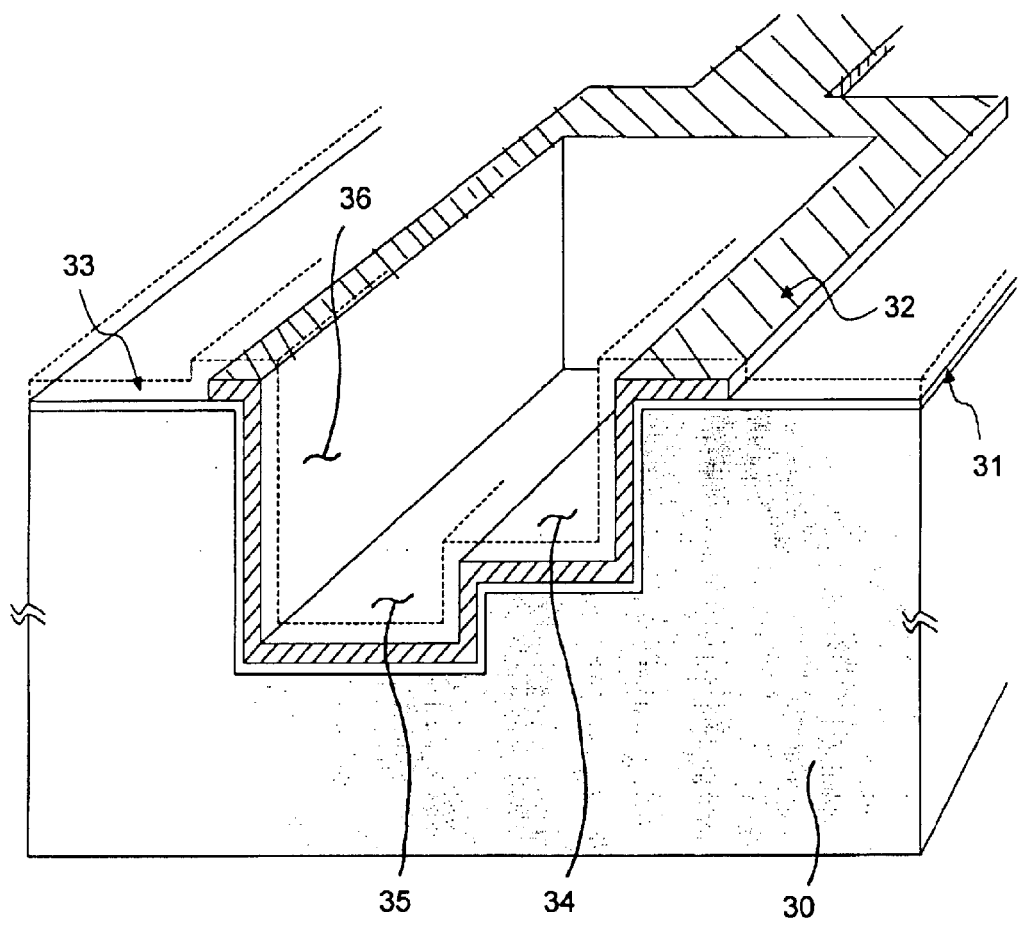
FIG. 4 is a perspective view illustrating the structure of the 2-step trench.

The resulting two-step trench is shown in detail in FIG. 4. FIG. 4 is the perspective view illustrating the two-step trench structure. The two-step trench can be divided into a fist trench portion 34 having a shallow depth and a second trench portion 35 having a deep depth. The first trench portion 34 restricts the rotating angle of the second plate 21 shown in FIG. 2 to 30 degree, and the second trench portion 35 restricts the rotating angle of the third plate 22 to 60 degree. One side wall 36 of the second trench portion 35 restricts the rotating angle of the fourth plate 23 to 90 degree. A second insulating film 33 can be deposited on the overall upper surface of the two-step trench shown in FIG. 4. The second insulating film 33 prevents the plate and the electrode from being damaged by the generation of the arcing due to the voltage applied to the first electrode layer 32, when the conductive second, third, and fourth plates are moved from the upper portion of the trench to the inner portion of the trench.

Hereinafter, the shape that each plate and each spring are attached on the two-step trench will be explained with reference to FIGS. 5 and 6.

Figure 5:
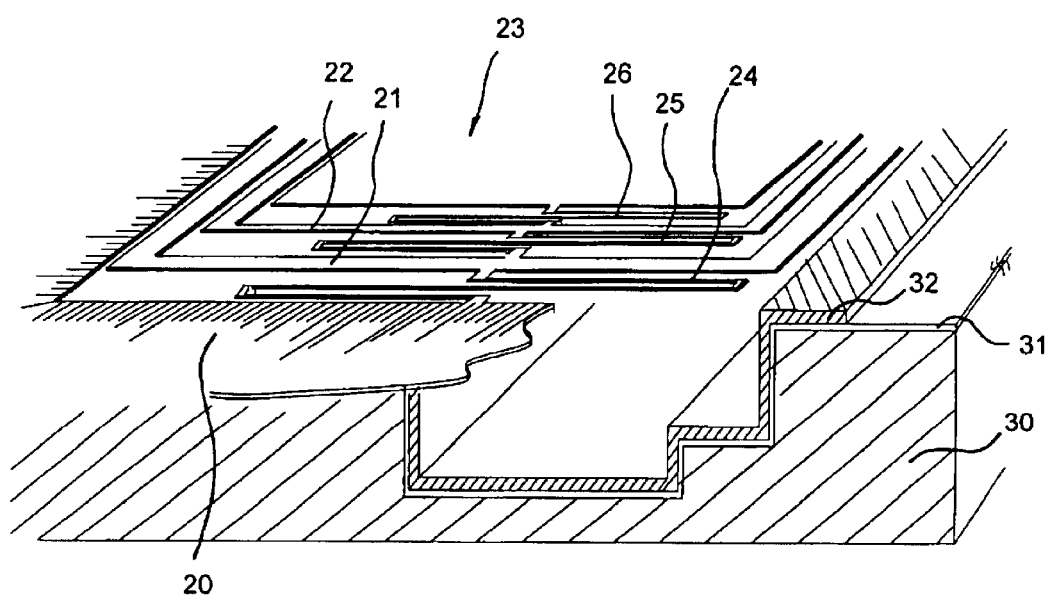
FIG. 5 illustrates a shape that plates and springs are attached to the 2-step trench shown in FIG. 4.

FIG. 5 illustrates a shape that plates and springs are attached on the 2-step trench shown in FIG. 4.

Referring to FIG. 5, the first spring 24 is connected to the first plate 20. The other end of the first spring 24 is connected to the second plate 21, and the third plate 22 and the fourth plate 23 are connected to each other through the second spring 25 and the third spring 26.

The method for forming each plate and each spring on the substrate will be described. An adhesive layer (not shown) is formed on the second insulating film (not shown in FIG. 5) of the substrate 30 and the adhesive layer in the trench is patterned. Since any material in the trench except for air can obstruct the rotating movement of the second, third, and fourth plates, the adhesive layer must be removed in the trench. After the adhesive layer is patterned, a silicon layer for actuation element is attached and polished to have a predetermined thickness. At this time, the silicon layer having a thickness of 50–625 $\mu$m is attached to the silicon substrate having trenches under an appreciate thermal and a pressure. And, the second, third and fourth plates 21, 22, 23 and the first, second, and third springs 24, 25, 26 are formed by etching the silicon layer. In FIG. 5, the first plate and the adhesive layer pattern formed on the substrate are not shown, for the convenience of the expression.

Figure 6:
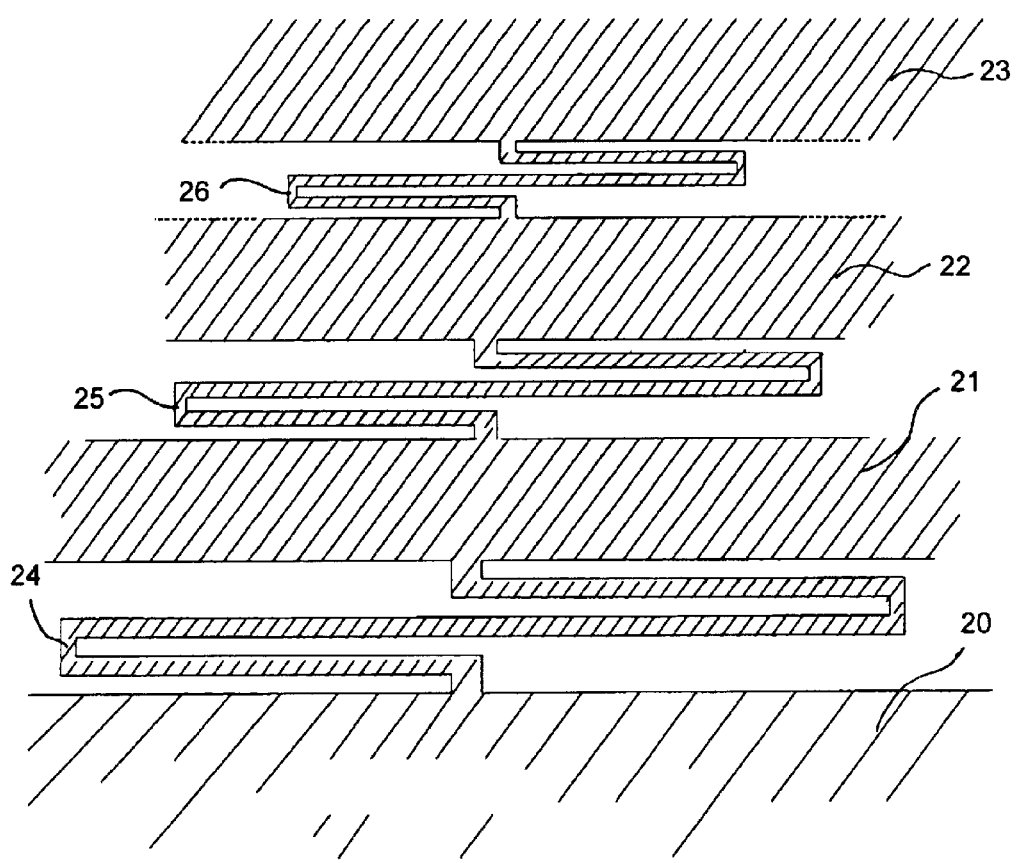
FIG. 6 illustrates the plates and the springs shown in FIG. 5 in detail.

FIG. 6 illustrates the plates and the springs shown in FIG. 5 in detail.

Figure 1A:
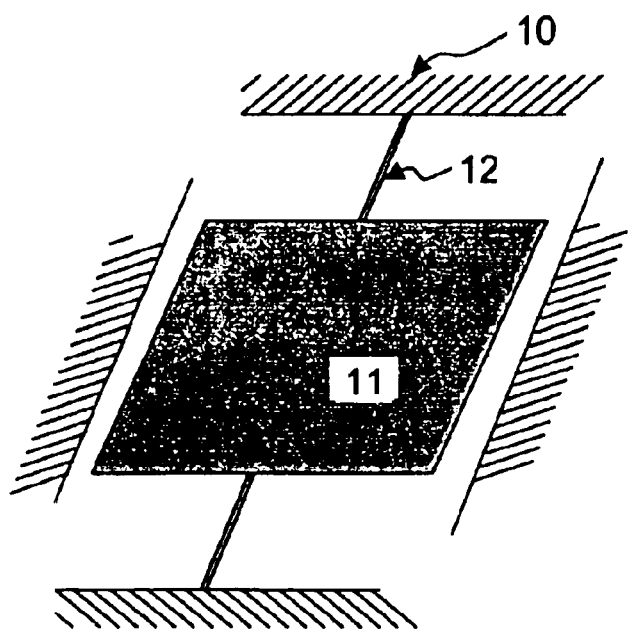
FIGS. 1A and 1B illustrate a conventional digital mirror.
Figure 1B:
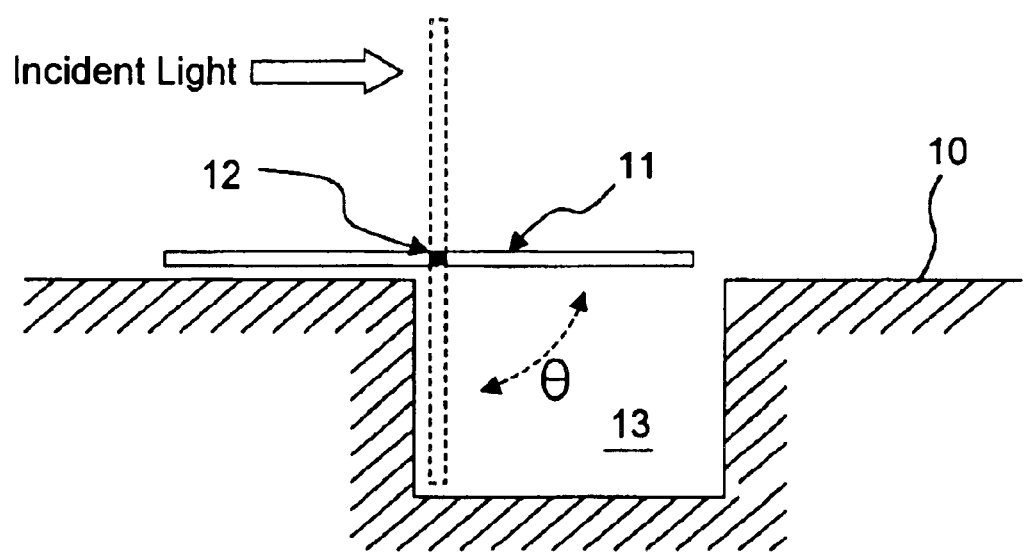

Referring to FIG. 6, the first spring 24 mechanically and electrically connects the first plate 20 with the second plate 21, and the second spring 25 mechanically and electrically connects the second plate 21 with the third plate 22. Similarly, the third spring 26 mechanically and electrically connects the third plate 22 with the fourth plate 23 of the mirror. Each spring shown in FIG. 6 is a meander type spring, and different from the torsion beam spring shown in FIG. 1. However, the meander type spring has an advantage of strengthening the width and the thickness of the spring compared with the torsion beam spring, and is suitable for performing the spring function in a narrow space between the plates. If the torsion beam spring is applied, the interval between the plates is increased, thereby the ratio of the area of the mirror to all the area of the actuator, that is, the fill factor becomes decreased. Accordingly, the interval between the mirrors becomes larger and the path of beam is increased, thereby a problem of increasing an optical loss can be generated. The present invention can use various types of the spring such as the meander type, the torsion beam type, or a complex type of them and the meander type spring, and the kind of the spring is not limited.

The configuration of the actuator for driving the digital mirror has been described so far, and, hereinafter, the principle of the operation of the actuator will be described.

Figure 7:
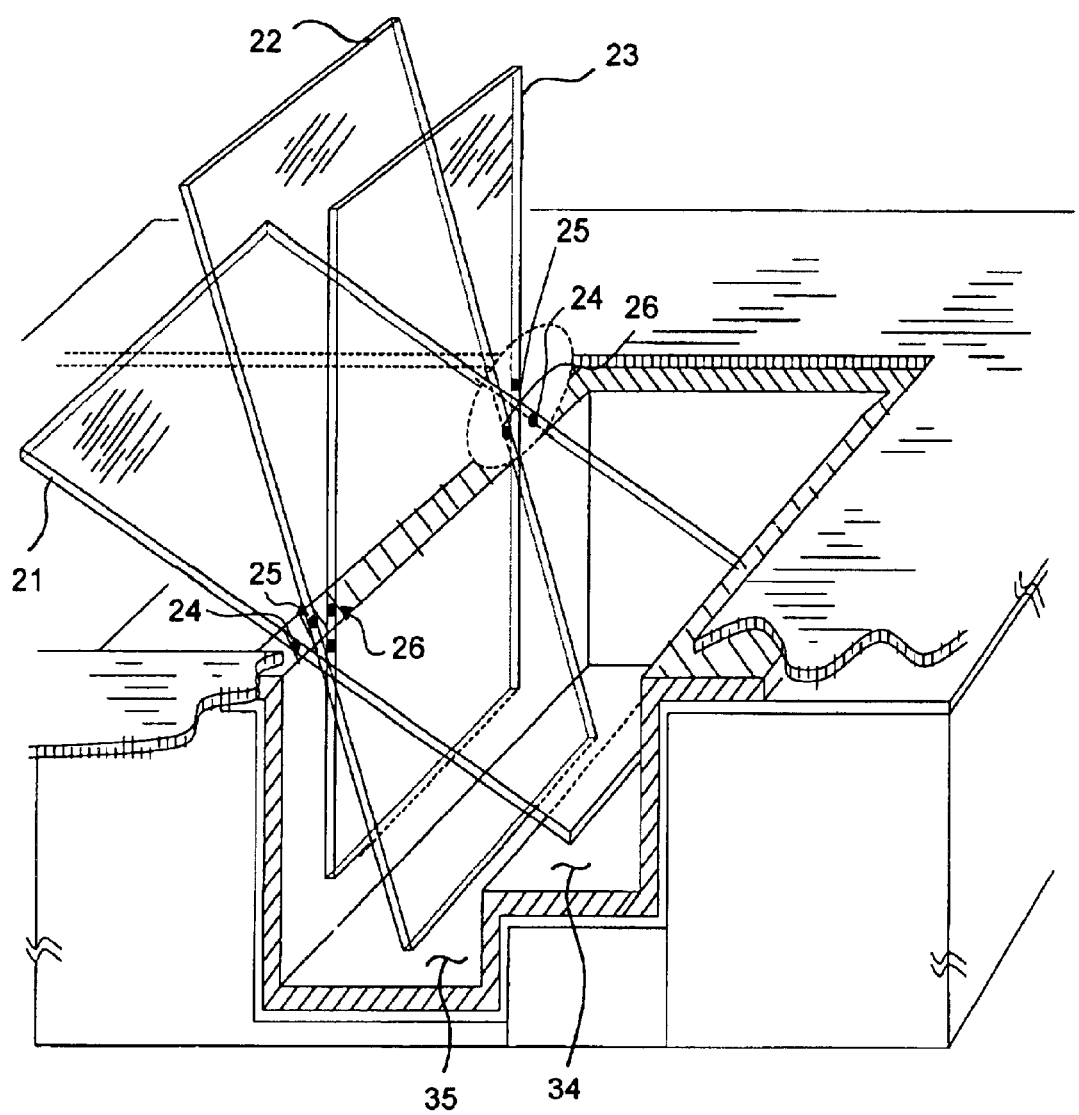
FIG. 7 illustrates the state that each plate is moved during an electrostatic force is applied.

FIG. 7 illustrates the state that each plate is moved during an electrostatic force is applied. In FIG. 7, each spring is represented as dot. Referring to FIG. 7, the second plate 21, the third plate 22, and the fourth plate 23 are grounded. For convenience, the metal layer for applying the voltage to the trench portion is referred to the first electrode (reference numeral 32 in FIG. 4), and, if the voltage is applied to the first plate against the first electrode, the second to fourth plates which can be moved to the inner portion of the trench come to experience the electrostatic force with the inner portion of the trench since the first plate is electrically connected with the second to fourth plates. At this time, each first plates of m×m switch arrays becomes the first plate itself which all the upper portions thereof are electrically connected, and, when the voltage is applied to any one of the electrodes in each switch array, the m×n switch array has a common voltage. The first plate may be called a common electrode, since all switch arrays are arranged on a first plate of silicon layer. Therefore, The first plate of all switches connected each other. Generally, the second electrode is grounded and the voltage is applied to the first electrode, thereby the electrostatic force can be generated. The voltage applied to the first electrode is not applied to any portion of the plate, since the insulating film is deposited on the electrode of the trench portion. Now, if a DC voltage is applied to the first electrode, an electric field is formed between the two-step trench and each plate, since each plate is electrically connected to each other. And, each plate at a dynamic possibility state is applied to the electrostatic force toward the first electrode. Among them, the fourth plate 23 is subjected to an electrical attractive force with side wall of the deep trench 35 and the second plate 21 is subjected to the electrical attractive force with the shallow trench 34 mainly. And, the third plate 22 is designed to be applied to a force at a similar ratio with respect to the deep trench 35 and the shallow trench 34. Since the distance between the second plate 21 and the trench is shorter than that between the fourth plate 23 and the trench, the electrostatic force per the area of the second plate 21 is stronger than that of the fourth plate 23. Accordingly, the second plate 21 can be readily landed on the shallow trench 34 with even the electrostatic force smaller than that of the conventional simple trench that is not the two-step trench, that is, a small voltage. This refers to a primary landing (a primary actuation). Since the third and fourth plates located in the second plate 21 are mechanically connected to each other by the second and third springs 25, 26, they are rotated by 30 degree, which is the landing angle of the second plate along with the landing of the second plate 21. The depth and the width of the two-step trench are designed in consideration with the length and the thickness of each plate, such that the rotating angle of each plate becomes 30 degree. Then, the landing of the third plate 22 (second landing; secondary actuation) and the landing of the fourth plate 23 (third landing; third actuation) are sequentially performed in the same principle. The third plate 22 is landed on the deep trench and the fourth plate 23 is landed on one side wall of the deep trench sequentially.

Figure 8:
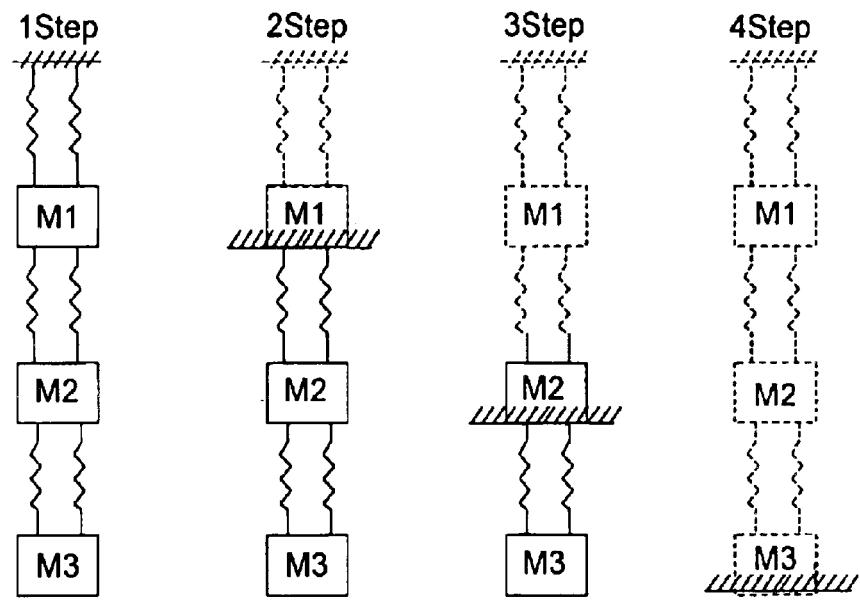
FIG. 8 dynamically illustrates the operation of each plate and each spring shown in FIG. 7.

FIG. 8 illustrates the operation of each plate and each spring shown in FIG. 7, in dynamics.

Referring to FIG. 8, each step virtually shows the connected state of the spring and the plate at the moment of each landing when the electrostatic force is applied to land of the plate. In FIG. 8, the mass M1 represents the second plate, M2 represents the third plate, and M3 represents the fourth plate. Since the springs are equipped at the both sides of each plate one by one, each mass is mechanically connected with other mass with two springs. The first step shows the state not applied to the electrostatic force is not applied. The second step shows the state that the second plate is landed on the shallow trench when the voltage is applied to the electrostatic force. In the second step, the reason why the mass M1 is disappeared is that it is equal to the state that the second plate is attached to the fixed wall, whereby the first spring is disappeared, by finishing the landing. Thus, the dynamic force field after the first landing is the same state as that only M2 and M3 are attached to the spring. In FIG. 8, the mass and the spring shown by a dotted line represent the same phenomenon as that they are disappeared after the landing, and the mass and the spring shown by a solid line represent the field which performs a current physical function. However, the terms "disappear" does not mean that it is mechanically disappeared, but that it physically does not exist in the dynamic force field.

A third step shows the state that the secondary landing of the third plate on the deep trench is finished under the continuous constant voltage, by using the second plate of which the landing is finished as a support point. As a result, it can be represented that M2 of the third plate and the second spring are disappeared, and only the fourth plate of the mirror and the third spring exist in the dynamic force field. Then, the fourth plate of the mirror is applied to the electrical attractive force by the voltage applied to the side wall of the deep trench to be landed on the side wall, thereby a third landing is finished at 90 degree on the surface of the substrate. As shown in the fourth step, all the masses and the springs are disappeared and it is not a dynamic field where the movement exists, in this state. At this time, a final switching-on state is finished.

Figure 9:
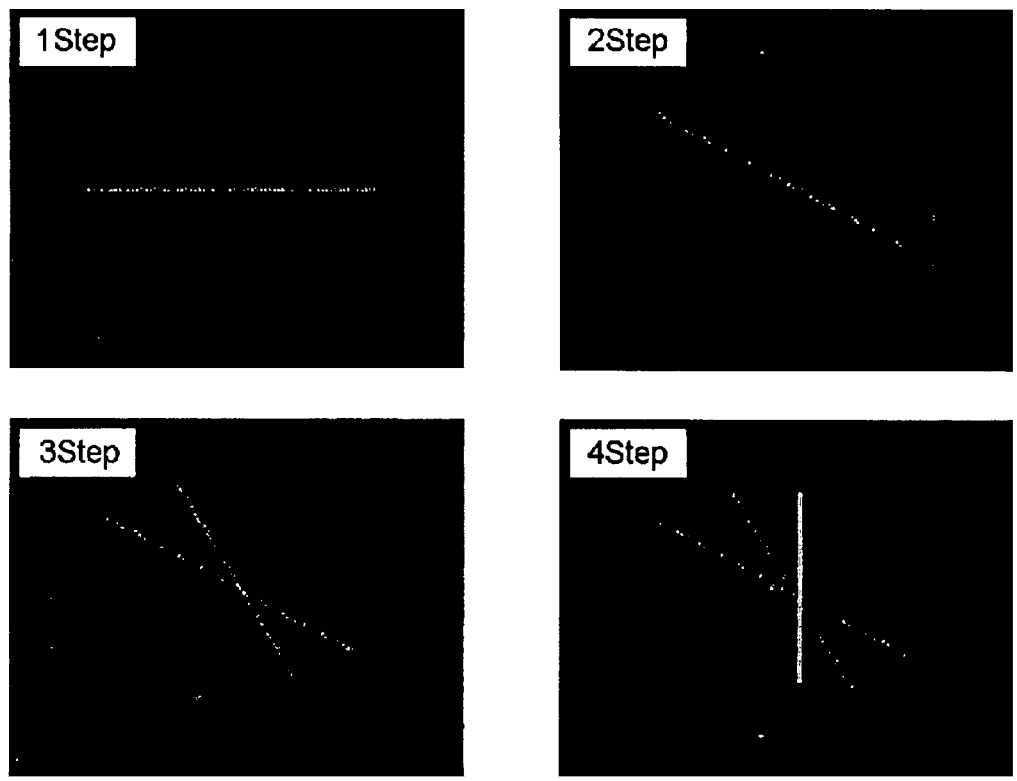
FIG. 9 illustrates the operation of a multi-step landing micro-mirror explained with reference to FIGS. 7 and 8.

FIG. 9 illustrates the operation of a multi-step landing micro-mirror explained with reference to FIGS. 7 and 8.

Each step in FIG. 9 shows the same steps as in FIG. 8. In FIG. 9, a first step shows the shape that the second plate has the third and fourth plates built-in, at the state of the electrostatic force not applied. The second plate in the second step has also the third and fourth plates built-in at the first landing state. The third plate in the third step has the fourth plate built-in at the second landing state. The fourth plate in the fourth step shows the state that the third landing of the fourth plate is finished. Like this, the fourth plate of the mirror has finally the rotating angle of 90 degree by 3 times landings, the switching-on state is finished. That is, the sum of the total rotating rotation angle of the first landing angle ($\theta_1$=30 degree), the second landing angle ($\theta_2$=30 degree), and the third landing angle ($\theta_3$=30 degree) becomes 90 degree (total rotating angle=$\theta_1+\theta_2+\theta_3$=90 degree). The third landing is designed to be vertically attached by the electrostatic force generated by the vertical wall side of the trench. In the present invention, each landing angle is not limited to even any value that is not 30 degree, since $\theta_1$, $\theta_2$, $\theta_3$ can have different values, respectively.

Hereinafter, the multi-step actuation according to the other embodiment of the present invention will be explained with reference to FIGS. 10 and 11.

Figure 10:
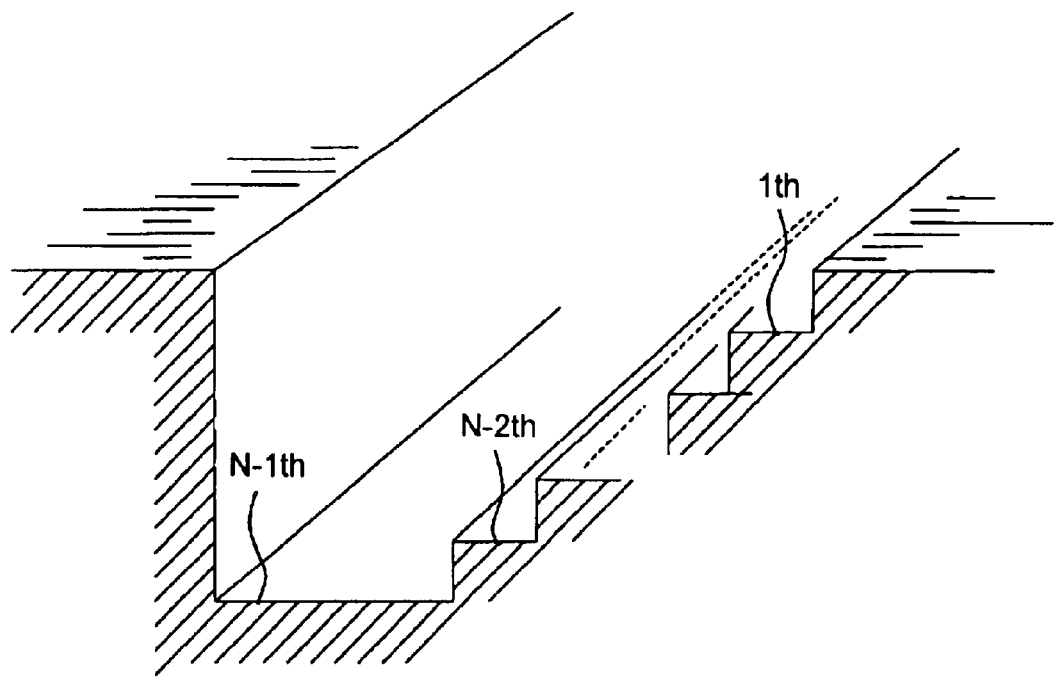
FIG. 10 shows the structure of a multi-step landing trench for multi-step actuation according to the other embodiment of the present invention.
Figure 11:
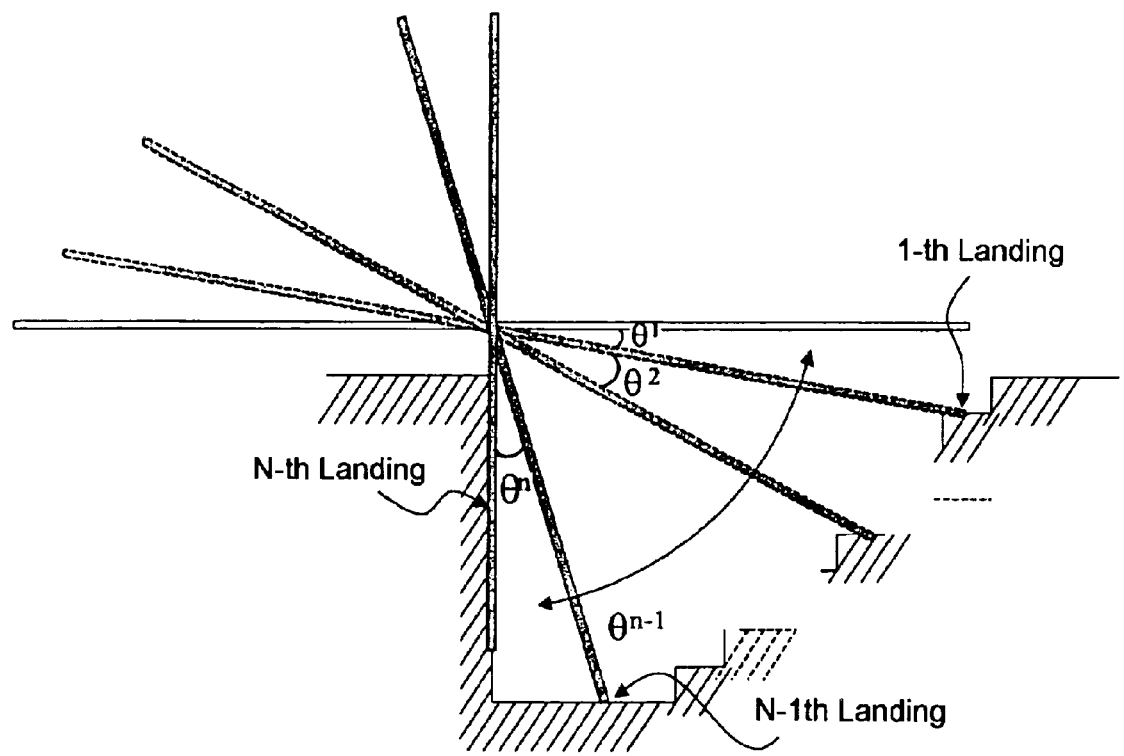
FIG. 11 illustrates the operation of the multi-step actuation according the other embodiment of the present invention.

FIG. 10 shows the structure of a multi-step landing trench for multi-step actuation according to the other embodiment of the present invention, and FIG. 11 illustrates the operation of the multi-step actuation according the other embodiment of the present invention.

With respect to the preferred embodiment of the present invention, as mentioned above, the actuator having the primary, secondary, and third landing is explained as an example, but more expended n-th landing could be possible. That is, referring to FIG. 10, the trench has n−1 steps, and the plates perform the n-th landing. Referring to FIG. 11, the multi-step actuator includes n plates which are rotatable and 2n springs. Accordingly, n plates perform the primary landing, the secondary landing, . . . , the n-th landing, and have the rotation angles $\theta_1, \theta_2, \ldots, \theta_n$, respectively. By having the structure as described above, the digital mirror having the target total rotating angle, by the sum of the continuous small rotation of each plate, can be constructed.

Hereinafter, the operation of the 3-step landing micro-mirror according to the preferred embodiment of the present invention will be explained with reference to FIGS. 12, 13, and 14.

Figure 12:
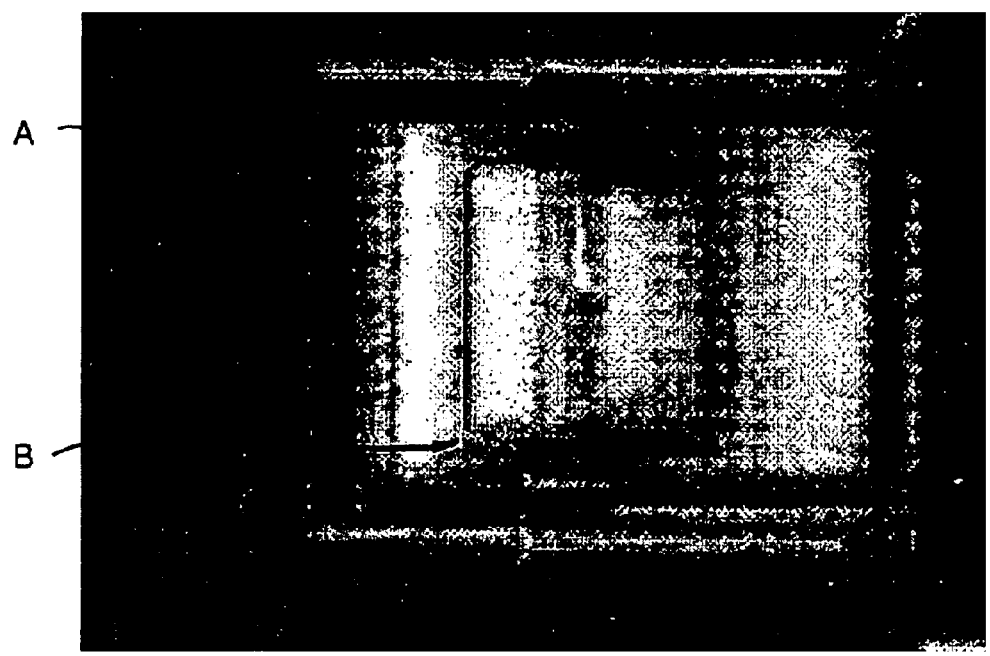
FIGS. 12, 13, and 14 are photographs that the multi-step landing micro-mirror according to the present invention is landed on the first and the second trench.
Figure 13:
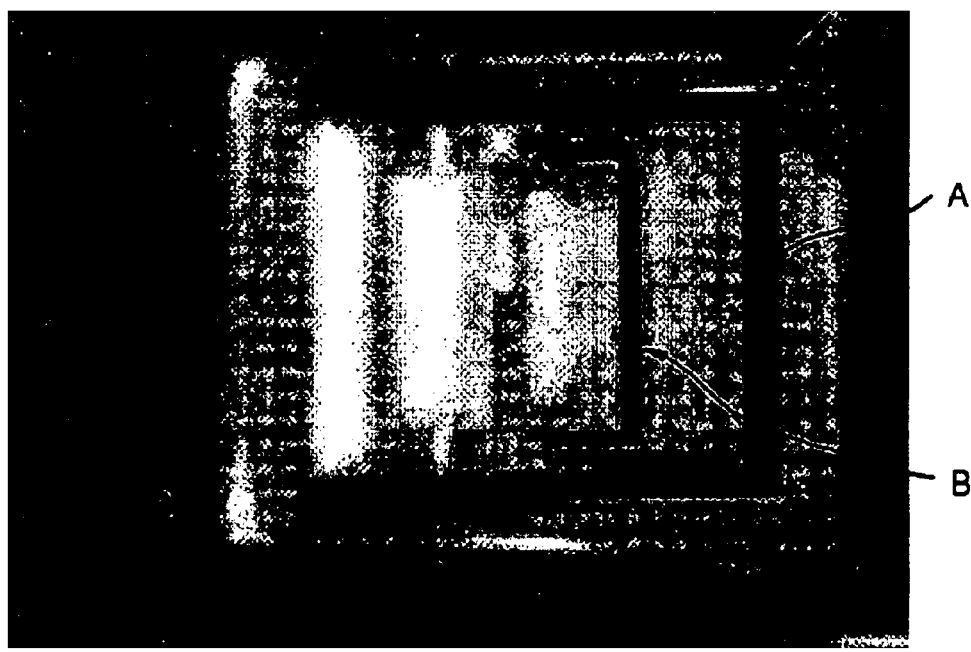
Figure 14:
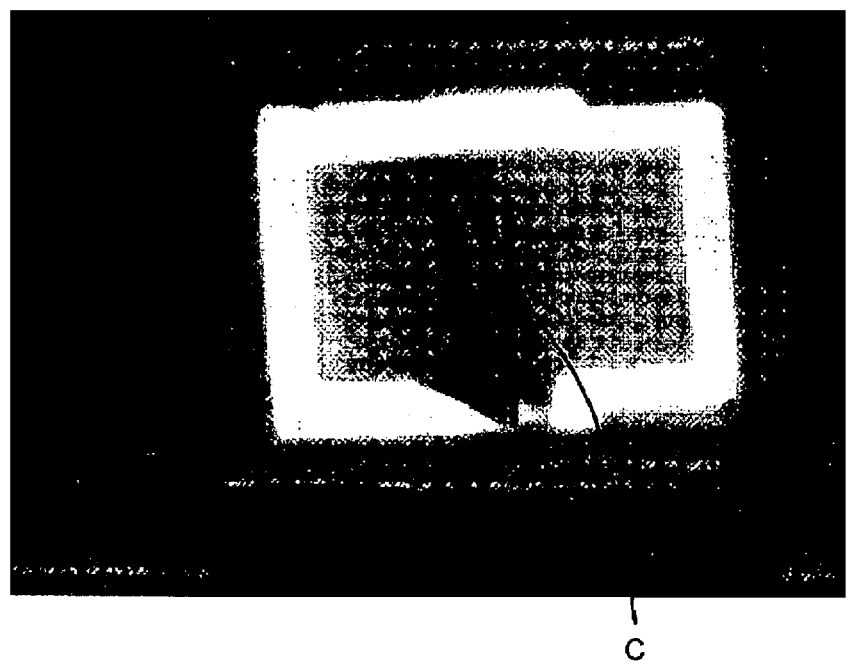

FIGS. 12, 13, and 14 are photographs that the 3-step landing micro-mirror according to the present invention is landed on first and second trench.

FIGS. 12, 13, and 14 show the shape that the second plate is landed on the first trench, the third plate is landed on the second trench at the switching-on state. In FIGS. 12 and 13, "A" and "B" represent the second plate and the third plate, respectively. FIG. 12 is the photograph pictured by a CCD camera under the condition that the focus distance is set in the lower portion of the second trench having a depth of 150 μm. FIG. 13 is the photograph pictured by the CCD camera under the condition that the highest point of the second plate is set as the focus distance of the plate. FIG. 14 is the photograph that is photographed by the CCD camera in the condition that the highest point of the fourth plate is set as the focus distance at the state that the fourth plate exists. In FIG. 4, "C" represents the fourth plate. Referring to FIGS. 12 to 14, it can be noted that the multi-step landing micro-mirror according to the preferred embodiment of the present invention has three plates and six springs and can be operated under the electrostatic force. Therefore, the expanded multi-step landing micro-mirror having n plates can be accomplished.

As mentioned above, the multi-step landing micro-mirror, the method for manufacturing the same, and the multi-step landing micro-mirror array according to the present invention can drive the low voltage driving by performing the multi-step driving under the applied electrostatic force, and enhance the elastic force of the spring for supporting the mirror, therefore improve the reliability of the optical switch.

That is, in the preferred embodiment of the present invention, since the spring applied to the torsion of 30 degree is rotated through the three steps as shown FIG. 9 to make the total rotating angle of 90 degree, the three springs are subjected to the torsion stress by only 30 degree, unlike the prior art that one spring is subjected to the torsion stress for the rotating angle of 90 degree. Accordingly, first, the endurance according to the repeated operation of the spring is increased, second, the endurance force of the translation of the mirror axis at the time of the rotation is increased by increasing the size such as the width and the thickness of the spring in comparison with the case of using one spring, and third, the restoring force is increased by increasing the width and the thickness of the spring so that the switching-off speed is increased, thereby the AC driving can be performed faster.

Although the present invention has been illustrated and described with respect to exemplary embodiments thereof, the present invention should not be understood as limited to the specific embodiment, and it should be understood by those skilled in the art that the foregoing and various other changes, omission and additions may be made therein and thereto, without departing from the spirit and scope of the present invention.

What is claimed is:

1. A multi-step landing micro-mirror, comprising:
   a trench formed in a substrate and having N−1 steps in one side wall thereof;
   N plates rotated in or on said trench; and
   2N springs for connecting said plates to each other;
   wherein said N plates are composed of an outermost first plate, a second plate connected with said first plate by the spring and located in said first plate, . . . , and a N-th plate connected with a (N−1)-th plate by the spring and located in said (N−1)-th plate,
   wherein N is an integer and equal or greater than 2, and
   wherein when voltages are applied to said N plates and said trench, respectively, said first plate is subjected to a first landing with a predetermined displacement angle on a first step of said trench due to the electrostatic force, said second plate is subjected to a second landing with the predetermined displacement angle on a second step of said trench, . . . , said N-th plate is subjected to a N-th landing with the predetermined displacement angle on the other side wall of said trench.

2. The multi-step landing micro-mirror according to claim 1, wherein the first plate, the second plate, . . . , and the (N−1)-th plate among said N plates have a rectangular ring shape.

3. The multi-step landing micro-mirror according to claim 1, wherein said N-th plate is the mirror having a rectangular shape.

4. The multi-step landing micro-mirror according to claim 1, wherein said 2N springs have a meander type, a torsion beam type, or a complex type of them.

5. The multi-step landing micro-mirror according to claim 1, wherein the sum total of the rotation angle of said first landing, the rotation angle of said second landing, . . . , and the rotation angle of said N-th landing is 90 degree.

6. A method for manufacturing the multi-step landing micro-mirror according to claim 1, comprising the steps of:

(a) forming a trench having N−1 steps formed in one side wall thereof in a substrate;

(b) forming a first insulating film in and on said substrate;

(c) depositing and patterning a conductive film in and on said substrate to form an electrode layer in and around said trench;

(d) forming a second insulating film in and on the substrate;

(e) attaching a silicon layer on and around said trench; and (f) etching said silicon layer to form N plates and 2N springs.

7. The method for manufacturing the multi-step landing micro-mirror according to claim 6, wherein said substrate is a glass or a silicon substrate.

8. The method for manufacturing the multi-step landing micro-mirror according to claim 6, further comprising the step of polishing said silicon layer to have a thickness in the range of 50 to 620 $\mu$m, after the step (e).

9. A multi-step landing micro-mirror array, wherein the multi-step landing micro-mirrors according to claim 1 are arranged on a same plane in a m×n matrix shape to obtain a plurality of the reflective light beams with respect to an incident light.

* * * * *